United States Patent
Park et al.

(10) Patent No.: US 8,115,189 B2
(45) Date of Patent: *Feb. 14, 2012

(54) SILICA NANOWIRE COMPRISING SILICON NANODOTS AND METHOD OF PREPARING THE SAME

(75) Inventors: Gyeongsu Park, Suwon-si (KR); Eunkyung Lee, Suwon-si (KR); Jaehak Lee, Seoul (KR); Byounglyong Choi, Seoul (KR); Jaegwan Chung, Seoul (KR); Sung Heo, Busan (KR)

(73) Assignee: Samsung Electronics Co., Ltd. (KR)

( * ) Notice: Subject to any disclaimer, the term of this patent is extended or adjusted under 35 U.S.C. 154(b) by 34 days.

This patent is subject to a terminal disclaimer.

(21) Appl. No.: 12/434,117

(22) Filed: May 1, 2009

(65) Prior Publication Data

US 2010/0006820 A1    Jan. 14, 2010

(30) Foreign Application Priority Data

Jul. 11, 2008    (KR) .................. 10-2008-0067813

(51) Int. Cl.
- H01L 29/06    (2006.01)
- H01L 29/00    (2006.01)
- H01L 47/00    (2006.01)
- H01L 31/00    (2006.01)
- H01L 21/31    (2006.01)
- H01L 21/469   (2006.01)
- G02B 6/036    (2006.01)
- G02B 6/02     (2006.01)

(52) U.S. Cl. .................. 257/9; 257/1; 257/14; 438/758; 385/126; 385/127; 385/128; 977/762; 977/774

(58) Field of Classification Search ................ None
See application file for complete search history.

(56) References Cited

U.S. PATENT DOCUMENTS

| | | | | |
|---|---|---|---|---|
| 6,297,095 | B1* | 10/2001 | Muralidhar et al. | 438/257 |
| 7,354,871 | B2* | 4/2008 | Lee et al. | 438/758 |
| 2004/0106285 | A1* | 6/2004 | Zacharias | 438/689 |
| 2010/0065809 | A1* | 3/2010 | Lee et al. | 257/9 |
| 2010/0084628 | A1* | 4/2010 | Lee et al. | 257/9 |

OTHER PUBLICATIONS

Du et al. "Formation of crystalline Si nanodots in SiO2 films by electron irradiation", 2003, Applied Physics Letter, vol. 82. No. 7, pp. 1108-1110.*

Takagi et al. "Quantum size effects on photoluminescence in ultrafine Si particles", 1990, Applied Physics Letter, vol. 56. No. 24, pp. 2379-2380.*

Zhang et al. "High reactivity of silicon suboxide clusters", 2001, Physical Review B, vol. 64, 113304.*

Park et al. In "A High-Density Array of Size-Controlled Silicon Nanodots in a Silicon Oxide Nanowire by Electron-Stimulated Oxygen Explusion", Mar. 27, 2009, Nano Letters, vol. 9, No. 5, 1780-1786.*

* cited by examiner

*Primary Examiner* — N Drew Richards
*Assistant Examiner* — Michael Jung
(74) *Attorney, Agent, or Firm* — Cantor Colburn LLP

(57) ABSTRACT

Provided are a silica nanowire that includes silicon nanodots and a method of preparing the same. The silica nanowire has excellent capacitance characteristics and improved light absorption ability, and thus can be effectively used in a variety of fields, such as various semiconductor devices including CTF memory, image sensors, photodetectors, light emitting diodes, laser diodes, and the like.

16 Claims, 10 Drawing Sheets

SILICA NANOWIRE COMPRISING SILICON NANODOTS AND METHOD OF PREPARING THE SAME

CROSS-REFERENCE TO RELATED PATENT APPLICATION

This application claims priority to Korean Patent Application No. 10-2008-0067813, filed on Jul. 11, 2008, and all the benefits accruing therefrom under 35 U.S.C. §119, the contents of which in its entirety are herein incorporated by reference.

BACKGROUND OF THE INVENTION

1. Field of the Invention

The present invention relates to a silica nanowire comprising silicon nanodots and a method of preparing the same, and more particularly, to a silica nanowire comprising silicon nanodots that has excellent capacitance characteristics and improved light absorbing ability.

2. Description of the Related Art

In general, nanowires are linear wires having a diameter on the order of a nanometers (1 nanometer ("nm")=$10^{-9}$ meters ("m")) and a length that is much larger than the diameter, for example, of the order of hundreds of nanometers, micrometers (1 micrometer ("μm")=$10^{-6}$ m), or millimeters (1 millimeter (mm)=$10^{-3}$ m) scale. The physical properties of such nanowires depend on the diameter and length thereof.

Presently, research into methods of preparing nanoparticles and studying the physical properties of nanoparticles is being actively pursued. However, general methods of manufacturing nanowires that can produce nanowires on commercial scales are not well developed yet.

Such methods generally comprise a method that employs a template and uses techniques such as chemical vapor deposition ("CVD"), laser ablation, and the like.

The methods that use a template generally use pores having a size from several nanometers to hundreds of nanometers. These pores generally serve as nucleation sites for growing the nanowire.

For example, metal nanowires can be produced by this method by oxidizing an aluminum electrode to form aluminum oxide on its surface. The surface is electrochemically etched to form nanopores following which the electrode is dipped into a solution containing metal ions and a current is applied to stack the metal ions on the aluminum electrode through the pores so that the pores are filled with metal ions. The oxide is then removed using an appropriate process, to obtain metal nanowires.

However, such a conventional method of manufacturing nanowires is disadvantageous because it is considerably complicated and requires a long period of time, and is thus unsuitable for mass production. The diameter and length of the nanowires depend on the diameter and depth of the pores. The state of current technologies is that it is nearly impossible to form pores having a size of several nanometers and having a depth from hundreds of micrometers to several millimeters. Therefore, it is very difficult to prepare nanowires having a diameter of several nanometers and a relatively long length.

CVD is a method in which a raw material gas comprising a desired material is injected into a reactor. The raw material gas is excited by heat or by a plasma so that it is decomposed, and the desired material reaches the surface of a substrate through which it diffuses. It then emanates from another surface of the substrate in the form of nanotubes or nanowires. Examples of CVD include low pressure CVD ("LPCVD"), atmospheric pressure CVD ("APCVD"), and high pressure CVD ("HPCVD"), characterized according to the pressure of the reactor; plasma enhanced CVD ("PECVD"), which can form nanotubes or the like, at a low temperature by using a plasma.

Laser ablation is a method used to synthesize single-layered carbon nanotubes and semiconductor nanowires. Compared to other methods, nano materials with considerably high purity can be obtained via this method, and it is easy to purify the nano materials obtained using laser ablation.

Nanowires prepared using such conventional methods can be used in electronic devices such as field effect transistors (FETs), sensors, photodetectors, and the like.

As an example of such nanowires, Korean Patent Publication No. 2007-0049035 discloses a method of preparing nanowires comprising metal nanodots. However, the nanodots are formed of metal and the size and density of the metal nanodots are limited.

Therefore, there is still a need to develop new nanowires having improved electrical properties and optical properties.

SUMMARY

Disclosed herein is a silica nanowire that includes silicon nanodots.

Disclosed herein too is a method of preparing the silica nanowire that includes silicon nanodots.

Disclosed herein too is a semiconductor device that includes the silica nanowire that includes silicon nanodots.

Disclosed herein too is a solar cell including the silica nanowire that includes silicon nanodots.

Disclosed herein too is a silica nanowire that includes silicon nanodots, wherein the silica nanowire has a core portion that includes a silicon rich oxide or metal nanodots.

Disclosed herein too is a method of preparing a silica nanowire that includes silicon nanodots, the method comprising coating a metal catalyst on a silicon substrate; heating the coated silicon substrate in an inert atmosphere; forming a silica nanowire from a wire source diffused through the coated silicon substrate; and irradiating the formed silica nanowire with an electron beam to form silicon nanodots.

Disclosed herein too is a semiconductor device comprising the silica nanowire that includes silicon nanodots.

Disclosed herein too is a solar cell comprising the silica nanowire that includes silicon nanodots.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
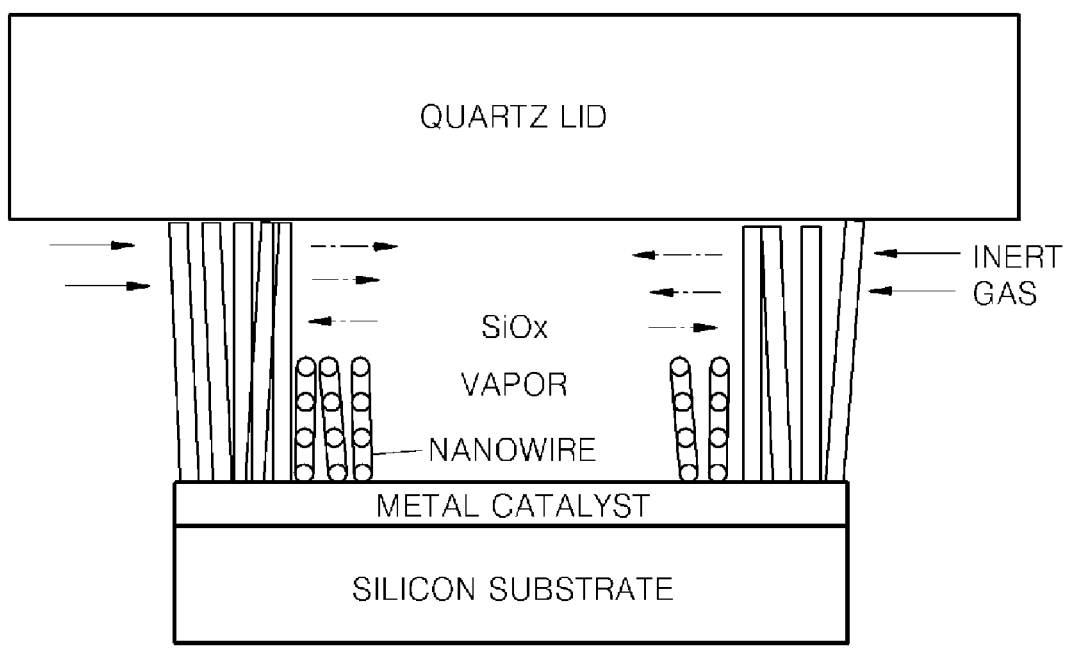
FIG. 1 is an exemplary schematic diagram illustrating equipment for manufacturing the silica nanowire.

The present invention will now be described more fully with reference to the accompanying drawings, in which exemplary embodiments of the invention are shown.

Aspects, advantages, and features of the present invention and methods of accomplishing the same may be understood more readily by reference to the following detailed description of preferred embodiments and the accompanying drawings. The present invention may, however, may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

Spatially relative terms, such as "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. However, the aspects, features, and advantages of the present invention are not restricted to the ones set forth herein. The above and other aspects, features and advantages of the present invention will become more apparent to one of ordinary skill in the art to which the present invention pertains by referencing a detailed description of the present invention given below.

Disclosed herein is a silica nanowire having a hetero structure that comprises at least two materials. The silicon nanowire comprises a silicon rich oxide or metal nanodots in a core portion thereof, and comprises silicon nanodots in an inner region thereof, the inner region excluding the core portion.

As a result of the silicon nanodots existing inside of the silica nanowire, the silica nanowire has improved physical properties, such as, for example, charge capacity characteristics, optical detection characteristics, charge trapping characteristics, and the like. The silicon nanodots, which are in the form of fine silicon crystals, can be formed inside of the silica nanowire and have a constant position and size. However, the silicon nanodots may have an irregular position and size.

The silicon nanodots can be formed by irradiating the silica nanowire with an electron beam. However, the formation of the silicon nanodots are limited to those cases where the silica nanowire has a specific core portion. In other words, the silicon nanodots can be formed by irradiating the silica nanowire that comprises metal nanodots in the core portion positioned at the center of the silica nanowire ((1)), or that comprises the silicon rich oxide in the core portion of the silica nanowire ((2)).

To form the silicon nanodots, the silica nanowire has one of the two structures described above and may be prepared as follows.

(1) When the Core Portion includes Metal Nanodots

Figure 2:
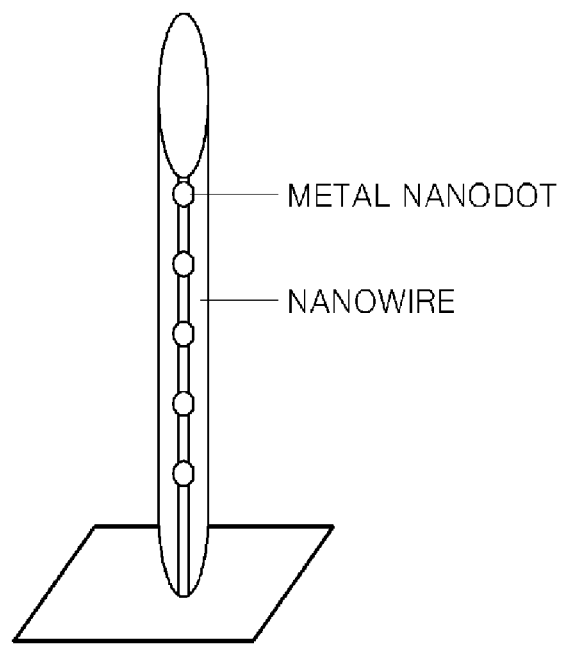
FIG. 2 is a cross-sectional view of a silica nanowire comprising metal nanodots in a core portion.

FIG. 2 is an exemplary cross-sectional view of a silica nanowire that comprises metal nanodots in the core portion. As illustrated in FIG. 2, when the core portion of the silica nanowire includes metal nanodots, the metal nanodots are connected to each other by the core portion, thereby being aligned in a single line at the center of the silica nanowire. In this regard, the core portion that includes the metal nanodots may comprise a silicon rich oxide or crystalline silicon. Also, the core portion may comprise just silica or a mixture of silicon and silica.

The metal nanodots included in the core portion may be formed of a metal that can be used as a catalyst in the growth of the silica nanowire. In particular, the metal may be at least one selected from the group consisting of gold (Au), nickel (Ni), iron (Fe), silver (Ag), palladium (Pd), and palladium/nickel (Pd/Ni). In an exemplary embodiment, the metal is Au.

The average diameter of the metal nanodot may be equal to or smaller than the diameter of the silica nanowire. For example, the average diameter of the metal nanodot may be 500 nm or less, specifically about 1 to about 100 nm, and more specifically about 2 to about 10 nm. The metal nanodots are separated from each other by an average distance of about 10 to about 1,000 nm.

(2) When the Core Portion comprises a Silicon Rich Oxide

Figure 3:
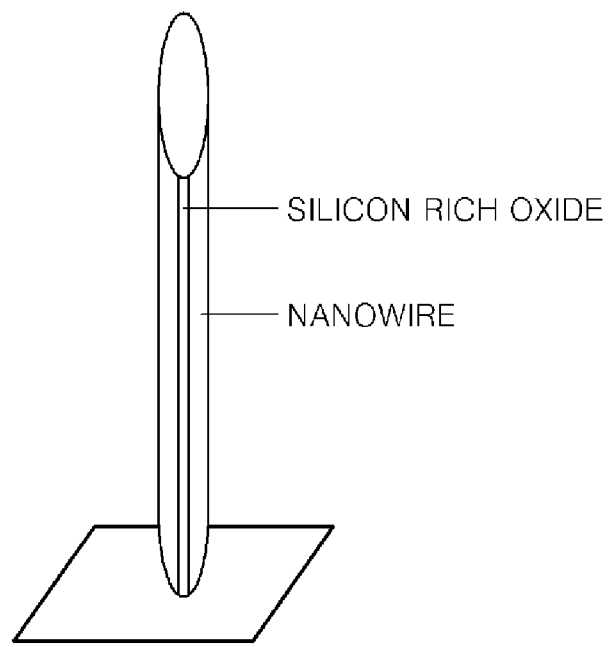
FIG. 3 is a cross-sectional view of a silica nanowire comprising a silicon rich oxide in the core portion.

FIG. 3 is an exemplary cross-sectional view of a silica nanowire comprising a silicon rich oxide in the core portion. As illustrated in FIG. 3, when the core portion of the silica nanowire comprises a silicon rich oxide (SiRO), a silicon rich oxide region exists at the center portion of the silica nanowire, with silica forming a shell layer that coats the core portion. The silica existing on the surface of the silica nanowire is produced by being oxidized in a separate process or by oxygen present in air.

The silicon rich oxide that constitutes the core portion of the silica nanowire may have a crystalline structure, and the amount of silicon (weight) may be about 1.5 to about 2 times larger than the amount of silica.

As described above, the silica nanowire comprises silicon nanodots in the core portion and comprises silica on the shell layer that coats the core portion, where the silicon nanodots exist on the shell layer.

The silicon nanodots can be crystallized depending upon the temperatures to which they are heated, the irradiation density and the irradiation time of the electron beam, and other factors used in the preparation process. Also, the size of the silicon nanodots can vary. In particular, it is possible to pattern a silicon nanodot forming region in the silica nanowire by selecting an irradiation region for the electron beam. That is, the electron beam is focused only on a certain portion of the silica nanowire, as a result of which the silicon nanodots are formed in only the irradiated portion of the silica nanowire, while the silicon nanodots are not formed in other regions that are not subjected to irradiation. Accordingly, patterning is possible by partial formation of the silicon nanodots.

The average diameter of silicon nanodots is in a range of about 1 to about 10 nm, and preferably, about 2 to about 8 nm.

The silicon nanodots can have a distribution of about $1.0 \times 10^{10}$ to about $1.0 \times 10^{25}$ numbers, and specifically about $1.0 \times 10^{15}$ to about $1.0 \times 10^{21}$ based on the volume (1 cubic centimeter ("cm$^3$")) of the silica nanowire. The distribution of the silicon nanodots can be adjusted by selecting an irradiating an appropriate section with the desired amount of radiation that can depend on the physical properties needed in a targeted application field.

Disclosed herein too is a method of preparing the silica nanowire comprising silicon nanodots, the method comprising preparing a silica nanowire and irradiating an electron beam to the silica nanowire to form silicon nanodots.

In general, the silica nanowire can be grown through a vapor-liquid-solid ("VLS") process or a solid-liquid-solid ("SLS") process. In an exemplary embodiment, the process is the SLS process. In particular, the VLS process is conducted in a manner such that vapor silicon-containing species introduced into a hot furnace are condensed and crystallized on the surface of a molten catalyst, such as gold, cobalt, nickel, or the like, and thus, are grown into silicon nanowires. On the other hand, the SLS process is conducted in a manner such that silicon diffused through a solid substrate (for example, a silicon substrate) is condensed and crystallized on the surface of a molten catalyst without the additional supply of vapor silicon, and thus, is grown into silicon nanowires.

The silica nanowire has a structure in which metal nanodots are aligned in the core portion of the silica nanowire that comprises the silicon rich oxide. Each step of the method of preparing the silica nanowire comprising silicon nanodots will now be described in greater detail.

Coating a Metal Catalyst on a Substrate

FIG. 1 is an exemplary schematic diagram illustrating equipment for manufacturing a silica nanowire. Referring to FIG. 1, a metal catalyst, for example, an Au metal catalyst is coated on a silicon substrate. In this regard, the silicon substrate may be previously washed using a conventional method to remove impurities.

When the SLS process is used, a separate wire source is not supplied, and a solid-state substrate (for example, a silicon substrate) itself acts as a source for the nanowires. Thus, the substrate may be any substrate that can act as a wire source. In particular, in addition to the silicon substrate, examples of the substrate may include a glass substrate coated with silicon and a plastic substrate coated with silicon.

The metal catalyst coated on the silicon substrate may be any metal so long as it enables growth of the wire. Examples of the metal may include Au, Ni, Fe, Ag, Pd, Pd/Ni, Ni and a combination comprising at least one of the foregoing metals. The metal catalyst may be coated on the substrate in the form of nanoparticles or in the form of a thin film, and the metal catalyst coating layer may be coated on the substrate to a thickness of about 50 nm or less.

The method of coating the metal catalyst on the substrate is not particularly limited. Examples of the coating process include CVD, sputtering, e-beam evaporation, vacuum deposition, spin coating, or dipping.

The diameter of the silica nanowire varies according to the diameter of the metal catalyst, and thus can be controlled by adjusting the diameter of metal catalyst. The adjustment of the diameter of metal catalyst directly affects the growth of the silica nanowire. To adjust the diameter of metal catalyst, a plurality of microgrooves having a plurality of microcavities can be formed on a surface of the substrate. For this, an oxidation process is performed on the surface of the substrate in which the microgrooves having the microcavities are to be formed. As a result of the oxidation process, a silicon oxide layer is formed on the surface of the silicon substrate. The oxidation process is a dry oxidation process under an oxygen ($O_2$) and chlorine gas ($Cl_2$) atmosphere. Nitrogen gas ($N_2$) can be further added to control the pressure within a processing chamber. The dry oxidation process is performed at a high temperature of about 1150° C. for a long period of time (i.e., several to tens of hours). The silicon oxide layer can also be formed using a wet oxidation process. The pressure inside the processing chamber is determined by oxygen ($O_2$) and chlorine gas ($Cl_2$), and chlorine gas ($Cl_2$) may be added in a smaller amount than the oxygen gas ($O_2$).

Placing the Coated Substrate in a Furnace and Heating the Furnace while a Gas is Injected thereto so that the Metal on the Substrate can be Contained in the Nanowire (as the Nanodots) during Growth of the Nanowire After the metal catalyst is coated on the substrate, the coated substrate is placed in a furnace as illustrated in FIG. 1. Then, while an inert gas, such as nitrogen, helium, or argon is injected into the furnace at a rate of, for example, about 100 standard cubic centimeters (sccm), the furnace is heated to a temperature of about 600 to about 1,200° C. for several minutes to several hours so that the metal on the substrate can be contained in the nanowire during the growth of the nanowire.

In this regard, the nanowire is grown by the phase-separation of silicon, which existed in a liquid state together with the metal catalyst. In the growing process of the nanowires, if metal gets sucked into a phase-separated portion of the silicon, the core portion of the nanowires includes the metal nanodots. On the other hand, if the metal does not get sucked into a phase-separated portion of the silicon, the core portion of the nanowires comprises a silicon rich oxide. In other words, nanowires having two structures can be produced in the same preparation process.

In the preparation process of the nanowires, the spacing between the metal nanodots is controlled by applying, for example, an electric field or a mechanical force, in addition to gravity. The heating process may be performed at a pressure of about 760 torr or less and at a temperature of about 600 to about 1200° C., and specifically about 800 to about 1200° C. for several minutes to several hours. The pressure, heating temperature, and heating time can vary according to the preparation process.

In particular, when the microgrooves having microcavities are formed on the substrate, the metal catalyst is agglomerated within the microgrooves by the heating process. Thus, the location and size of the metal catalyst are controlled, regions in which the metal catalyst is formed are limited through this, and the size of the metal catalyst can also be controlled according to the size of the microgrooves.

Using a Wire Source Diffused from the Substrate to Form Silica Nanowires

In the VLS process, a separate vapor-phase wire source is used, while, in the SLS process, a wire source diffuses through a substrate to be grown into nanowires.

Thus, the wire source that diffuses from the substrate depends on the surface area of the substrate, and the greater the surface area of the substrate, the larger the amount of wire source that can diffuse from the substrate and the faster the rate of growth of the nanowires.

In addition, when the nanowire includes the metal nanodots, the metal nanodots exist inside the nanowire in the form of dots when the nanowire is grown. Thus, the number of the metal nanodots depends on the amount of metal catalyst initially coated on the silicon substrate.

The growth length of the nanowire may be controlled by adjusting the heating temperature and heating time. For example, the growth of the nanowire can be terminated if the temperature is decreased to about 700° C. by using natural cooling or cooling by a flow a gas such as nitrogen gas.

Meanwhile, to adjust the diameter of the nanowire, an additional oxidation process may be performed. An additional oxidation process may be performed after the nanowires are formed. This facilitates the formation of silicon oxidation layer on the sides of the nanowires, which permits the thickness of the nanowires to be adjusted.

Irradiating an Electron Beam to the Formed Silica Nanowires

An electron beam with an acceleration voltage of 100 kV or greater is used to form silicon nanodots.

Crystalline properties and size of the silicon nanodots depend on the intensity of the electron beam and the heating temperature and heating time. In particular, the rate of formation of the silicon nanodots may be controlled by adjusting the degree of vacuum in a reaction chamber.

The intensity of the electron beam is determined by the current density and irradiation time of the electron beam. The current density of the electron beam may be about 5 to about 200 amperes per square centimeter ("$A/cm^2$") and specifically about 10 to about 50 $A/cm^2$. When the current density of the electron beam is less than about 5 $A/cm^2$, the silicon nanodots do not form. On the other hand, when the current density of the electron beam is greater than about 200 $A/cm^2$, the shape of the silicon nanodots is severely modified due to damage caused by the electron beam. The irradiation time of the electron beam may vary according to the current density of the electron beam, and may be in the range of several seconds to several hours, specifically in the range of about 1 second to about 1 hour, and more preferably in the range of about 10 seconds to about 10 minutes.

The current density and irradiation time of the electron beam may also vary according to the diameter of the silicon nanowires, and also affects the crystalline content and size of the silicon nanodots to be formed, and thus can be selected in appropriate ranges according to the desired purpose.

During irradiation with the electron beam, the heating temperature and time also affects the crystalline characteristics and size of the silicon nanodots. When the heating temperature and time increases, the size of the formed silicon nanodots increases, and the crystalline size and content also increase. The heating temperature may be in the range of about 200 to about 1100° C., and the heating time can be appropriately adjusted by adjusting the irradiation time of the electron beam.

The formation speed of the silicon nanodots varies according to the degree of vacuum in the reaction chamber, and the degree of vacuum may be in the range of about 40 to about 700 torr. When the degree of vacuum is not within these ranges, nanowires having the desired structure may not be formed.

The silica nanowires comprising silicon nanodots obtained as described above have superior capacitance characteristics when compared with that of a material used as a capacitor in conventional semiconductors. In addition, the electron trapping ability of the silicon nanodots is improved, and thus the silica nanowires comprising silicon nanodots are suitable for use in semiconductor devices, for example, bottom-up type cross-track-flash ("CTF") memory devices. In addition, when the silica nanowires comprising silicon nanodots are used in solar cells, it is easy to adjust the thickness of the nanowires in order to adjust the amount of light and sensitivity. In addition, by the adjusting the size of the silicon nanodots, it is possible to absorb light with infrared ray wavelengths, visible ray wavelengths, and ultraviolet ray wavelengths, and thus the photoelectron generation efficiency can be significantly increased. Moreover, by varying the size of the silicon nanodots of the silica nanowires, various types of nanowires in which absorption wavelength bands are adjusted can be obtained. When these nanowires are used in image sensors, it is possible to miniaturize the size of red-green-blue ("RGB") plane arrangement pixels and a vertical arrangement of the structure is possible. Thus, image sensors with high sensitivity can be manufactured.

Hereinafter, the present invention will be described in further detail with reference to the following examples. These examples are for illustrative purposes only and are not intended to limit the scope of the present invention.

Preparation Example 1

Preparation of Silica Nanowires comprising Metal Nanodots

An n-type silicon substrate was treated with an organic cleaner and hydrofluoric acid to remove any naturally occurring oxide film, and then Au nanoparticles (available from Nippon Paint Co. Ltd) were spin-coated on the n-type silicon substrate to a thickness of 30 nm. Subsequently, in order to grow silica nanowires, the n-type silicon substrate was put into a microchamber covered by a quartz lid as illustrated in the FIG. 1. Then, the n-type silicon substrate was heated at a rate of about 10 to about 15° C. per minute while supplying argon of 100 sccm at a pressure of 500 torr. When the process temperature reached 1000° C., the n-type silicon substrate was held at this temperature for 30 minutes to grow the silica nanowires. Thereafter, the temperature was slowly and naturally decreased to about 700° C., after which the growth of the silica nanowires was terminated.

Figure 4:
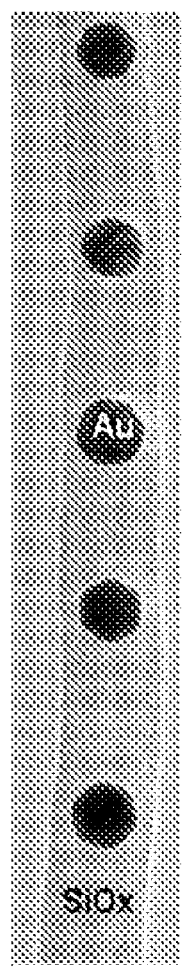
FIG. 4 is a transmission electron microscopic ("TEM") image of a silica nanowire comprising metal nanodots prepared in Preparation Example 1.
Figure 5:
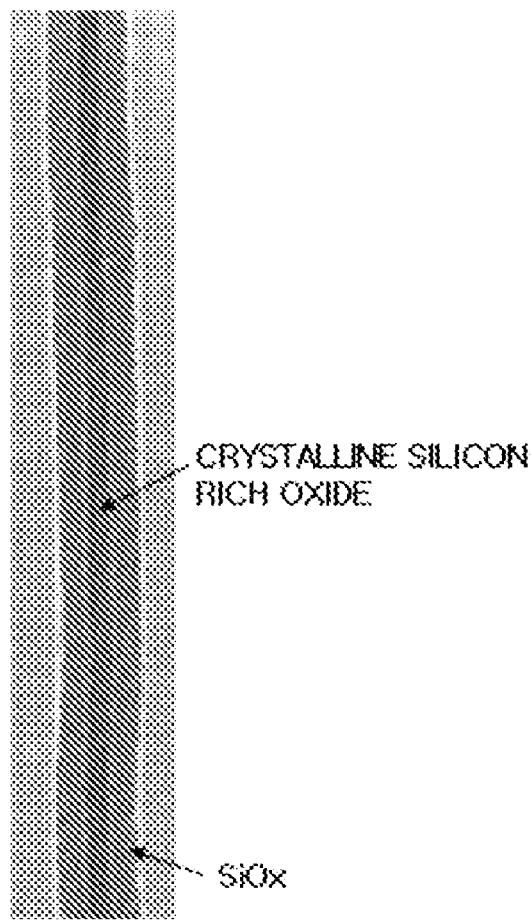
FIG. 5 is a TEM image of a silica nanowire comprising a silicon rich oxide prepared in Preparation Example 1.

As a result of formation of the silica nanowires, two types of the silica nanowires were formed: silica nanowires including metal nanodots in its core portion (Refer to FIG. 4), and silica nanowires in which the core portion comprised a silicon rich oxide (Refer to FIG. 5).

A transmission electron microscopic (TEM) image and energy dispersive spectroscopy (EDS) of the silica nanowires including the metal nanodots were respectively analyzed using a Tecnai Ge device manufactured from FEI. As a result, it was confirmed that the metal nanodots were aligned inside the silica nanowires, and the metal nanodots were formed of Au.

Preparation Example 2

Preparation of Silica Nanowires comprising Silicon Rich Oxide

The silica nanowires of which core portion comprised a silicon rich oxide was separated from the two types of the silica nanowires prepared in Preparation Example 1, and a TEM image was taken. As a result, it was confirmed that the core portion comprised the silicon rich oxide.

Example 1

An electron beam having a current density of 4.8 A/cm$^2$ was irradiated to the silica nanowires of Preparation Example 1 by using a TEM for 45 minutes to form silicon nanodots.

Figure 6:
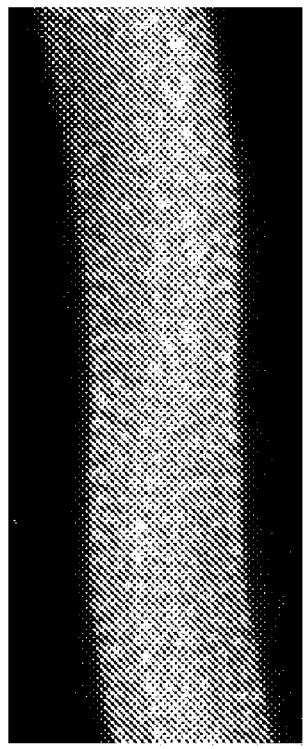
FIG. 6 is a TEM image of a silica nanowire comprising silicon nanodots prepared in Example 1.

FIG. 6 is an energy-filtered TEM image of a silica nanowire comprising silicon nanodots prepared in Example 1. From this, it can be seen that the silicon nanodots were formed by electron beam irradiation.

Example 2

Silica nanowires having a diameter of 76 nm from the Preparation Example 2 were irradiated with an electron beam having a current density of 1.15 A/cm$^2$ using a TEM for 20 minutes and 60 minutes respectively to form silicon nanodots.

Figure 7:
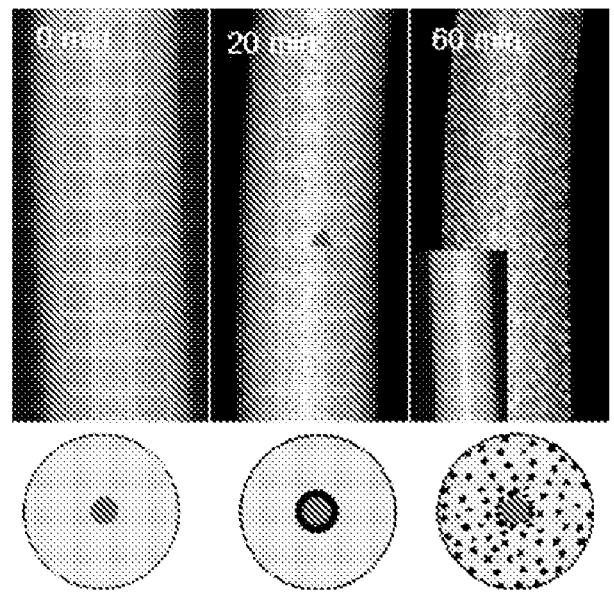
FIG. 7 is a TEM image of a silica nanowire comprising silicon nanodots prepared in Example 2.

FIG. 7 shows energy-filtered TEM images of the silica nanowires to which the electron beam was not irradiated and the silica nanowires including the silicon nanodots. From this, it can be seen that the silicon nanodots were formed.

Example 3

Silica nanowires having a diameter of 49 nm of the Preparation Example 2 were irradiated by an electron beam having a current density of 1.15 A/cm$^2$ by using a TEM for about 20 minutes and about 60 minutes each to form silicon nanodots.

Figure 8:
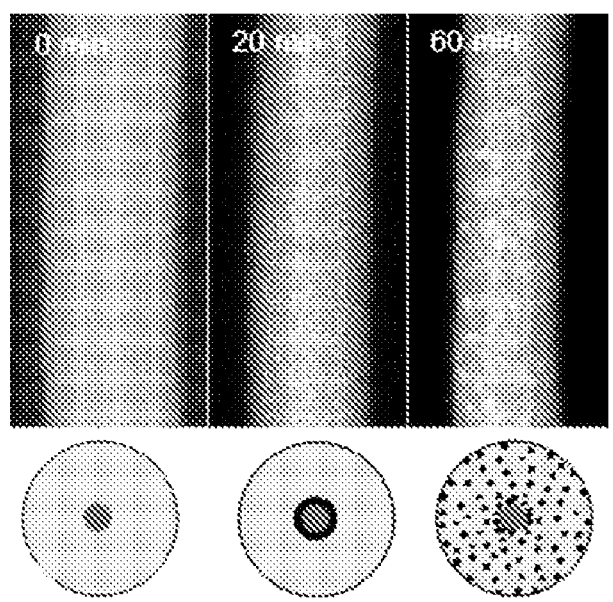
FIG. 8 is a TEM image of a silica nanowire comprising silicon nanodots prepared in Example 3.

FIG. 8 shows TEM images of the silica nanowires to which the electron beam was not irradiated and the silica nanowires including the silicon nanodots. From this, it can be seen that the silicon nanodots were formed.

Example 4

Silica nanowires having a diameter of 61 nm of the Preparation Example 2 were irradiated with an electron beam, and patterning was performed as follows.

Figure 9:
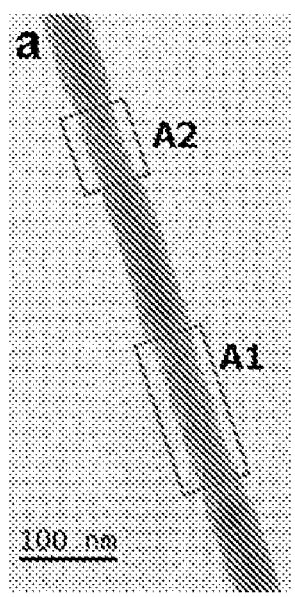
FIG. 9 is a TEM image of a silica nanowire comprising silicon nanodots prepared in Example 4, which is to be partially patterned.
Figure 10:
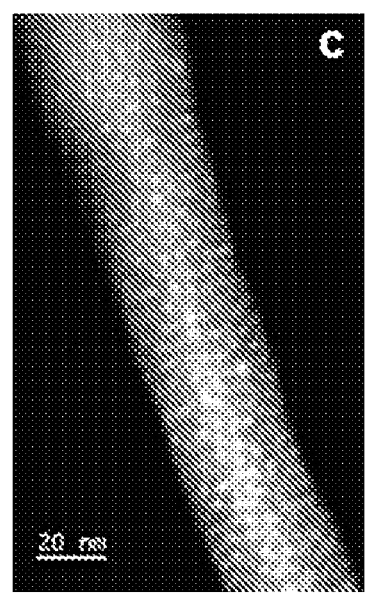
FIG. 10 is a TEM image of a partially patterned portion of the silica nanowire comprising silicon nanodots of Example 4.

The electron beam having a current density of 36.1 A/cm$^2$ was irradiated on to a portion A1 illustrated in FIG. 9 by using a TEM for 3 minutes to form silicon nanodots. The results are illustrated in FIG. 10.

Figure 11:
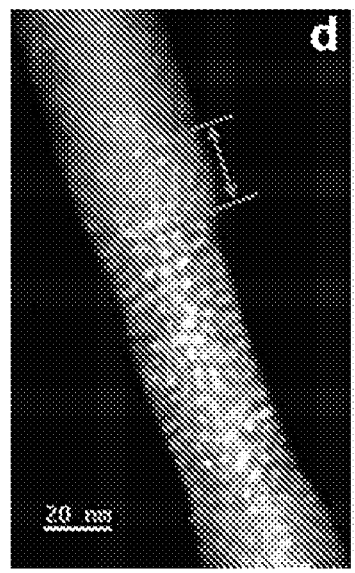
FIG. 11 is a TEM image of another partially patterned portion of the silica nanowire comprising silicon nanodots of Example 4.

Similarly, the electron beam having a current density of 100.2 A/cm$^2$ was irradiated on to a portion A2 illustrated in FIG. 9 by using a TEM for 1 minute to form silicon nanodots. The results are illustrated in FIG. 11.

Example 5

Silica nanowires having a diameter of 57 nm of the Preparation Example 1 were irradiated with an electron beam, and patterning was performed as follows.

Figure 12:
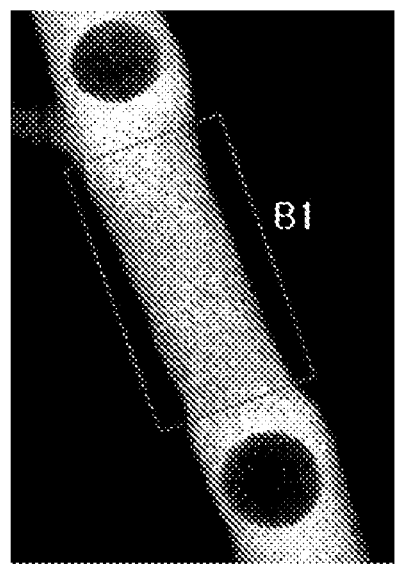
FIG. 12 is a TEM image of a silica nanowire comprising silicon nanodots prepared in Example 5, which is to be partially patterned.
Figure 13:
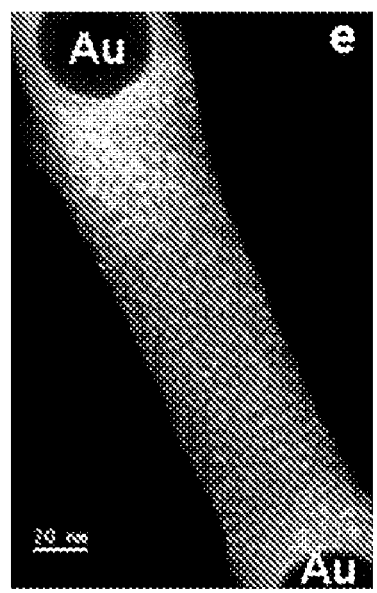
FIG. 13 is a TEM image of a partially patterned portion of the silica nanowire comprising silicon nanodots of Example 5.

The electron beam having a current density of 59.5 A/cm$^2$ was irradiated on to a portion B1 illustrated in FIG. 12 by using a TEM for 7 minutes to form silicon nanodots. The results are illustrated in FIG. 13.

Experimental Example

Measurement of Physical Properties

Figure 14:
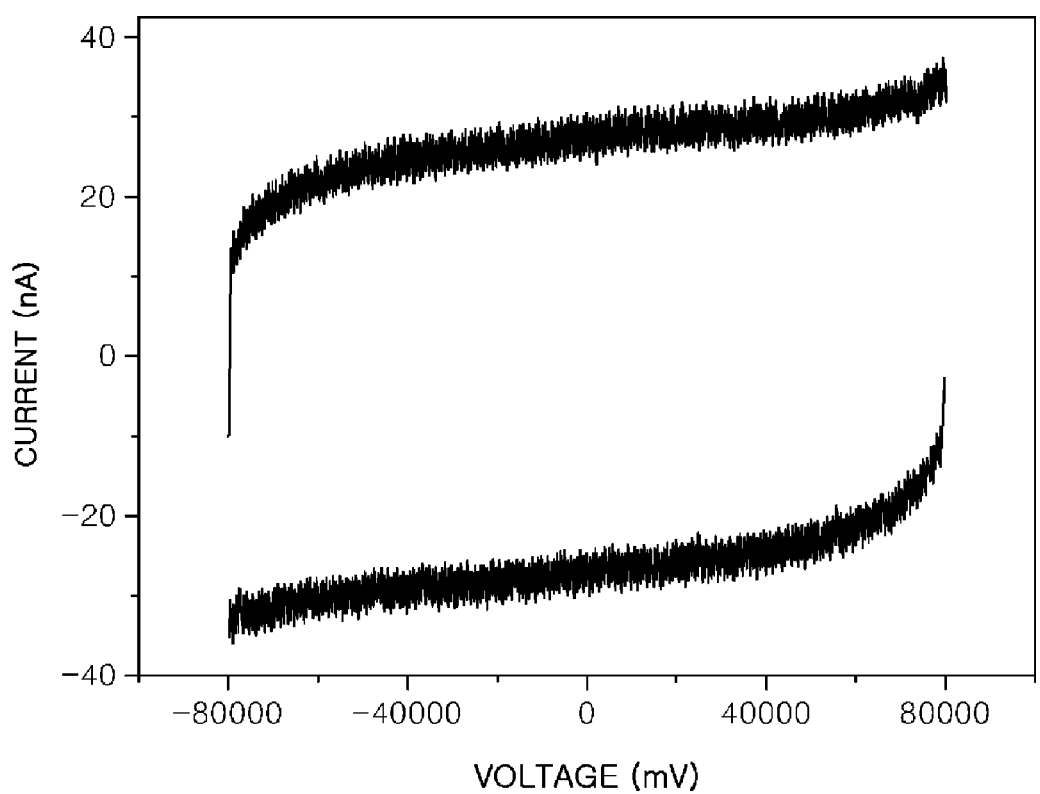
FIG. 14 is a graph showing measurement results of capacitance of the silica nanowire comprising silicon nanodots of Example 2.

The capacitance of the silica nanowires comprising silicon nanodots prepared in Example 2 was measured using in-situ scanning transmission microscope/transmission electron microscope ("STM/TEM"). FIG. 14 is a graph showing measurement results of capacitance of the silica nanowire comprising silicon nanodots of Example 2. As a result, the capacitance thereof was 0.27 nanofarads ("nF").

From the above examples it can be seen that silica nanowires can comprise silicon nanodots. In addition, it can be seen that silica nanowires with improved physical properties can be prepared by adjusting the size, density, crystalline properties and interval of the silicon nanodots. Therefore, the silica nanowires comprising silicon nanodots can be effectively used in a variety of semiconductor devices including CTF memory, image sensors, photodetectors, light emitting diodes, laser diodes, and the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silica nanowire comprising a core portion and an inner region surrounding and contacting the core portion, wherein the core portion comprises a silicon rich oxide and the inner region comprises silicon nanodots.

2. The silica nanowire of claim 1, wherein the silicon nanodots exist inside the silica nanowire, outside the core portion.

3. The silica nanowire of claim 1, wherein an average diameter of the silicon nanodots is in a range of about 1 to about 10 nanometers.

4. The silica nanowire of claim 1, wherein the silicon nanodots have a distribution of about $1.0 \times 10^{10}$ to about $1.0 \times 10^{25}$ numbers based on a volume of 1 cubic centimeter of the silica nanowire.

5. The silica nanowire of claim 1, wherein the silicon rich oxide that constitutes the core portion is crystalline.

6. The silica nanowire of claim 1, wherein the silicon nanodots are patterned on a portion of the silica nanowire.

7. A semiconductor device comprising a silica nanowire of claim 1.

8. A solar cell comprising a silica nanowire comprising silicon nanodots of claim 1.

9. A method of forming a silica nanowire, comprising:
forming a core portion of the silica nanowire; and
forming an inner region of the silica nanowire surrounding and contacting the core portion, wherein the core portion comprises a silicon rich oxide and the inner region comprises silicon nanodots.

10. The method of claim 9, further comprising:
coating a metal catalyst on a silicon substrate to form a coated silicon substrate;
heating the coated silicon substrate in an inert atmosphere;
forming the silica nanowire from a wire source that diffuses from the coated silicon substrate; and
irradiating the silica nanowire with an electron beam to form the silicon nanodots in the inner region.

11. The method of claim 10, wherein the metal catalyst is selected from the group consisting of gold, nickel, iron, silver, palladium, nickel-palladium and a combination comprising at least one of the foregoing metals.

12. The method of claim 10, wherein the silicon substrate comprises microgrooves having micro cavities.

13. The method of claim 10, wherein the heating process in operation (b) is performed at a temperature in a range of about 600-1200° C.

14. The method of claim 10, wherein the heating is performed at a pressure of 760 ton or less.

15. The method of claim 10, wherein the electron beam has a current density of about 5 to about 200 A/cm$^2$, and is irradiated for about 1 second to about 1 hour.

16. The method of claim 10, wherein during the irradiation, the silicon substrate is heated to a temperature of about 200 to about 1100° C., and the heating time is in a range of about 1 to about 120 minutes.

* * * * *